US008559587B1

(12) United States Patent
Buell et al.

(10) Patent No.: US 8,559,587 B1
(45) Date of Patent: Oct. 15, 2013

(54) FRACTIONAL-N DIVIDERS HAVING DIVIDER MODULATION CIRCUITS THEREIN WITH SEGMENTED ACCUMULATORS

(75) Inventors: Brian Buell, Gilbert, AZ (US); Benedykt Mika, Chandler, AZ (US); Chen-Wei Huang, Tempe, AZ (US)

(73) Assignee: Integrated Device Technology, inc, San Jose, CA (US)

( * ) Notice: Subject to any disclaimer, the term of this patent is extended or adjusted under 35 U.S.C. 154(b) by 0 days.

(21) Appl. No.: 13/425,761

(22) Filed: Mar. 21, 2012

(51) Int. Cl.
*H03K 21/00* (2006.01)
(52) U.S. Cl.
USPC .............................................. 377/47; 377/48
(58) Field of Classification Search
None
See application file for complete search history.

(56) References Cited

U.S. PATENT DOCUMENTS

| | | | |
|---|---|---|---|
| 4,686,488 A | | 8/1987 | Attenborough |
| 5,079,521 A | * | 1/1992 | Gaskell et al. ................. 331/1 A |
| 6,064,272 A | * | 5/2000 | Rhee .................. 331/16 |
| 6,353,649 B1 | * | 3/2002 | Bockleman et al. .......... 375/376 |
| 6,621,317 B2 | * | 9/2003 | Saeki ............................ 327/163 |
| RE40,424 E | * | 7/2008 | Han et al. .......................... 377/48 |
| 7,417,510 B2 | * | 8/2008 | Huang ............................. 331/74 |
| 7,450,680 B2 | * | 11/2008 | Mar .................. 377/47 |
| 7,532,081 B2 | | 5/2009 | Partridge et al. |
| 7,593,496 B2 | | 9/2009 | Fan et al. |
| 7,724,097 B2 | | 5/2010 | Carley et al. |
| 7,969,251 B2 | * | 6/2011 | Fu et al. ........................... 331/74 |
| 2003/0048863 A1 | * | 3/2003 | Saeki ............................ 375/376 |
| 2004/0211819 A1 | * | 10/2004 | Ezumi et al. ................ 228/112.1 |
| 2005/0094757 A1 | * | 5/2005 | Meninger et al. ............. 375/376 |
| 2011/0095830 A1 | * | 4/2011 | Tsangaropoulos et al. ..... 331/34 |
| 2012/0169387 A1 | * | 7/2012 | Hara ............................. 327/156 |

OTHER PUBLICATIONS

Floyd, Brian A., Sub-Integer Frequency Synthesis Using Phase-Rotating Frequency Dividers; IEEE Transactions on Circuits and Systems—I: Regular Papers, vol. 55, No. 7, Aug. 2008, pp. 1823-1833.
$I^2C$-Programmable Any-Frequency, Any-Output Quad Clock Generator—Si5338; Silicon Labs; Rev.1.0 Jan. 2011; Copyright© 2011 by Silicon Laboratories; 42 pages.
Li Zhang et al., entitled "*A Hybrid Spur Compensation Technique for Finite-Modulo Fractional-N Phase-Locked Loops*", IEEE Journal of Solid-State Circuits, vol. 44, No. 11, pp. 2922-2934, Nov. 2009.
Rohde, Ulrich L., Synthesizer Design for Microwave Application; Department of Electrical Engineering, Universities of Oradea, Bradford, and George Washington; Copyright© 1999 by Ulrich L. Rohde—p. 1 of 51.

(Continued)

*Primary Examiner* — Tuan T Lam
(74) *Attorney, Agent, or Firm* — Myers, Bigel, et al

(57) ABSTRACT

Fractional-N divider circuits include a multi-modulus divider, which is configured to perform at least /N and /N+1 frequency division of a first reference signal received at a first input thereof. This division is performed in response to an overflow signal received at a second input thereof, where N is an integer greater than one. A phase correction circuit is configured to generate a second reference signal in response to a divider output signal generated by the multi-modulus divider. A divider modulation circuit is provided, which is configured to generate the overflow signal in response to a code that specifies a plurality of division moduli to be used by the multi-modulus divider. The divider modulation circuit includes a segmented accumulator, which is configured to generate a plurality of segments of a count value having at least one period of latency therebetween.

21 Claims, 4 Drawing Sheets

(56) References Cited

OTHER PUBLICATIONS

S. Pamarti et al., entitled "*A Spur Elimination Technique for Phase Interpolation-Based Fractional-N PLLs*", IEEE Trans. on Circuits and Systems, vol. 55, No. 6, pp. 1639-1647, Jul. 2008.

Shu et al.; *CMOS PLL Synthesizers: Analysis and Design*; Chapter 2, pp. 16-19; Springer Science+Business Media, 2005.

\* cited by examiner

FRACTIONAL-N DIVIDERS HAVING DIVIDER MODULATION CIRCUITS THEREIN WITH SEGMENTED ACCUMULATORS

FIELD

The present invention relates to frequency synthesizer circuits and, more particularly, to frequency synthesizer circuits that perform fractional division of high frequency reference signals.

BACKGROUND

Fractional-N frequency synthesizers can be used to overcome many limitations associated with integer-N frequency synthesizers. In fractional-N frequency synthesizers, the effective frequency divide ratio is a fractional number, which enables a relatively high frequency reference signal to be used to achieve fine resolution of frequencies in synthesizer output signals. This fractional number is typically achieved by periodically changing an integer divide ratio so that a desired fractional number can be approximated. One typical disadvantage associated with fractional-N frequency synthesis is the generation of unwanted low-frequency "spurs" by a dual-modulus (or multi-modulus) divider. These spurs make fractional-N frequency synthesizers impractical for many applications unless they are suppressed to a negligible level. Conventional spur reduction techniques include: (i) digital-to-analog (DAC) phase estimation, (ii) random jittering, which randomizes a divide ratio, (iii) sigma-delta ($\Sigma\Delta$) noise shaping, which modulates a divide ratio, (iv) phase interpolation; and (v) pulse generation. Some of these spur reduction techniques are disclosed in articles by: S. Pamarti et al., entitled "*A Spur Elimination Technique for Phase Interpolation-Based Fractional-N PLLs*", IEEE Trans. on Circuits and Systems, Vol. 55, No. 6, pp. 1639-1647, July (2008); and Li Zhang et al., entitled "*A Hybrid Spur Compensation Technique for Finite-Modulo Fractional-N Phase-Locked Loops*", IEEE Journal of Solid-State Circuits, Vol. 44, No. 11, pp. 2922-2934, November (2009).

As illustrated by FIG. 1A, a frequency synthesizer 10 may include a fractional-N divider 12 within a feedback path of a phase-locked loop (PLL), which filters jitter in the output of the divider 12. This fractional-N divider 12 may operate by modulating between two or more integer values. The phase-locked loop of FIG. 1A contains a phase detector 14, which receives an input reference signal (e.g., 25 MHz), a charge pump 16, a loop filter 18 and a voltage-controlled oscillator (VCO) 20. This VCO 20 generates an output signal having a frequency that is a non-integer multiple of the frequency of the input reference signal. An integer divider 22 may also be provided for generating an output signal at a reduced frequency relative to the VCO output signal. Examples of the frequency synthesizer 10 of FIG. 1A are disclosed at U.S. Pat. No. 7,532,081 to Partridge et al., entitled "Frequency and/or Phase Compensated Microelectromechanical Oscillator," and FIG. 3 of U.S. Pat. No. 7,417,510 to Huang, entitled "Direct Digital Interpolative Synthesis".

FIG. 1B illustrates a frequency synthesizer 10', which includes an integer divider 12' within a feedback path of a phase-locked loop (PLL). This phase-locked loop contains a phase detector 14, which receives an input reference signal (e.g., 25 MHz), a charge pump 16, a loop filter 18 and a voltage-controlled oscillator (VCO) 20, which generates an output signal having a frequency that is an integer multiple of the frequency of the input reference signal. Multiple fractional-N dividers 22a-22d may be provided for generating output signals having different frequencies, which do not have integer relationships with the output frequency of the VCO 20. As will be understood by those skilled in the art, additional circuitry may be needed to reduce jitter in the signals generated by the dividers 22a-22d. The dividers 22a-22d may be provided as interpolative dividers as disclosed at FIGS. 4-6 of the '510 patent to Huang. For example, as shown by FIG. 5 of Huang, an interpolative divider can include a fractional-N divider, which receives a VCO clock. A first order delta sigma modulator receives a digital divide ratio (MIN). The integer portion of the digital divide ratio is supplied to the fractional-N divider as a divide control signal, which can be a stream of integers that approximate the fractional divide ratio. A digital quantization error, which corresponds to the fractional portion of the divide ratio, is supplied to a digitally controlled phase interpolator. The jitter introduced by the fractional-N divider can be canceled by interpolation in the phase interpolator, which is based on the digital quantization error supplied by the delta sigma modulator. In this manner, the input clock from the VCO is first divided down by the fractional-N divider according to the control information provided by the delta sigma modulator and then the phase interpolator operates to cancel quantization errors in the output of the fractional-N divider. Additional examples of fractional-N frequency synthesizers, which utilize an accumulator within a numerically-controlled oscillator and a phase interpolator, are disclosed at FIG. 6 of the '510 patent to Huang and in U.S. Pat. No. 7,724,097 to Carley et al., entitled "Direct Digital Synthesizer for Reference Frequency Generation."

SUMMARY

Fractional-N divider circuits according to some embodiments of the invention include a multi-modulus divider, which is configured to perform at least /N and /N+1 frequency division of a first reference signal received at a first input thereof. This division is performed in response to an overflow signal received at a second input thereof, where N is an integer greater than one. These embodiments of the invention further include a phase correction circuit configured to generate a second reference signal in response to a divider output signal generated by the multi-modulus divider. This second reference signal has a duty cycle that is more nearly uniform relative to the divider output signal. A divider modulation circuit is provided, which is configured to generate the overflow signal in response to a code that specifies a plurality of division moduli to be used by the multi-modulus divider during the at least /N and /N+1 frequency division of the first reference signal. This code may be a digital code that specifies a repeating sequence of division moduli to be used by the multi-modulus divider during the at least /N and /N+1 frequency division of the first reference signal.

According to some embodiments of the invention, the divider modulation circuit includes a segmented accumulator. This segmented accumulator is configured to generate a plurality of segments of a count value having at least one period of latency therebetween. In particular, the segmented accumulator may include a first accumulator segment responsive to a plurality of least significant bits of the digital code and last accumulator segment responsive to a plurality of most significant bits of the digital code. Each of these first and last accumulator segments is synchronized to an accumulator clock signal and generates a respective segment overflow signal. In some embodiments of the invention, this accumulator clock signal may be the divider output signal.

In additional embodiments of the invention, the phase correction circuit may include a pulse-width locked loop and this pulse-width locked loop may include a delay line having a plurality of voltage-controlled delay cells therein. The phase correction circuit includes a latch having a synchronization terminal responsive to the divider output signal and a data input terminal responsive of a fed back version of the second reference signal. The phase correction circuit may also be responsive to a digital quantization error generated by a divider modulation circuit and phase error calculator.

According to still further embodiments of the invention, a fractional-N divider circuit may include a multi-modulus divider, which is configured to perform at least /N and /N+1 frequency division of a first reference signal received at a first input thereof in response to an overflow signal received at a second input thereof. A phase correction circuit is provided, which is configured to generate a second reference signal in response to a divider output signal generated by the multi-modulus divider. This phase correction circuit can include a duty cycle adjustment circuit, which is responsive to the divider output signal and a feedback signal derived from the second reference signal. A phase interpolator is also provided, which is responsive to at least one signal generated by the duty cycle adjustment circuit. A divider modulation circuit is provided, which is configured to generate the overflow signal in response to a code that specifies a plurality of division moduli to be used by the multi-modulus divider during the at least /N and /N+1 frequency division of the first reference signal. According to some of these embodiments of the invention, the duty cycle adjustment circuit includes a pair of latches having data terminals responsive to the feedback signal and clock terminals responsive to true and complementary versions of the divider output signal. The phase interpolator may also be responsive to a pair of signals derived from outputs of the pair of latches. According to still further embodiments of the invention, the divider modulation circuit includes a segmented accumulator, which is configured to generate a plurality of segments of a count value having at least one period of latency therebetween. This segmented accumulator may include a first accumulator segment responsive to a plurality of least significant bits of a digital code and last accumulator segment responsive to a plurality of most significant bits of the digital code. Each of these first and last accumulator segments may be synchronized to an accumulator clock signal and may generate a respective segment overflow signal. In some alternative embodiments of the invention, each of the first and last accumulator segments may be synchronized to a synchronizing signal derived from the second reference signal. This synchronizing signal may have a frequency greater than a frequency of the second reference signal.

DETAILED DESCRIPTION OF EMBODIMENTS

Figure 1A:
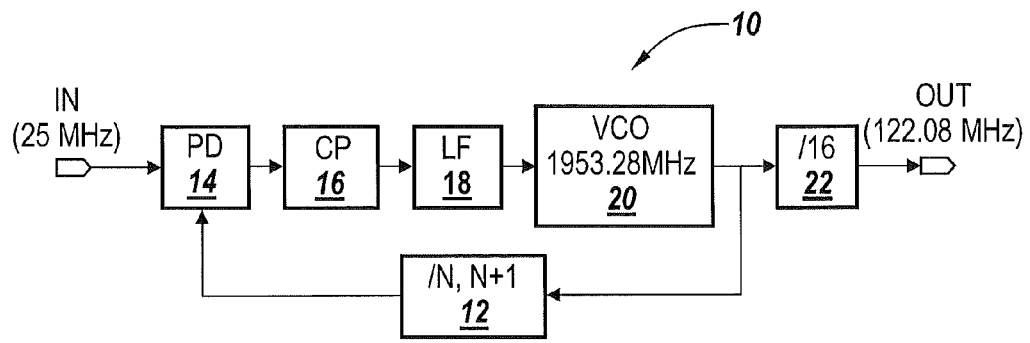
FIG. 1A is a block diagram of a frequency synthesizer that utilizes a fractional-N divider within a feedback path of a phase-locked loop (PLL), according to the prior art.
Figure 1B:
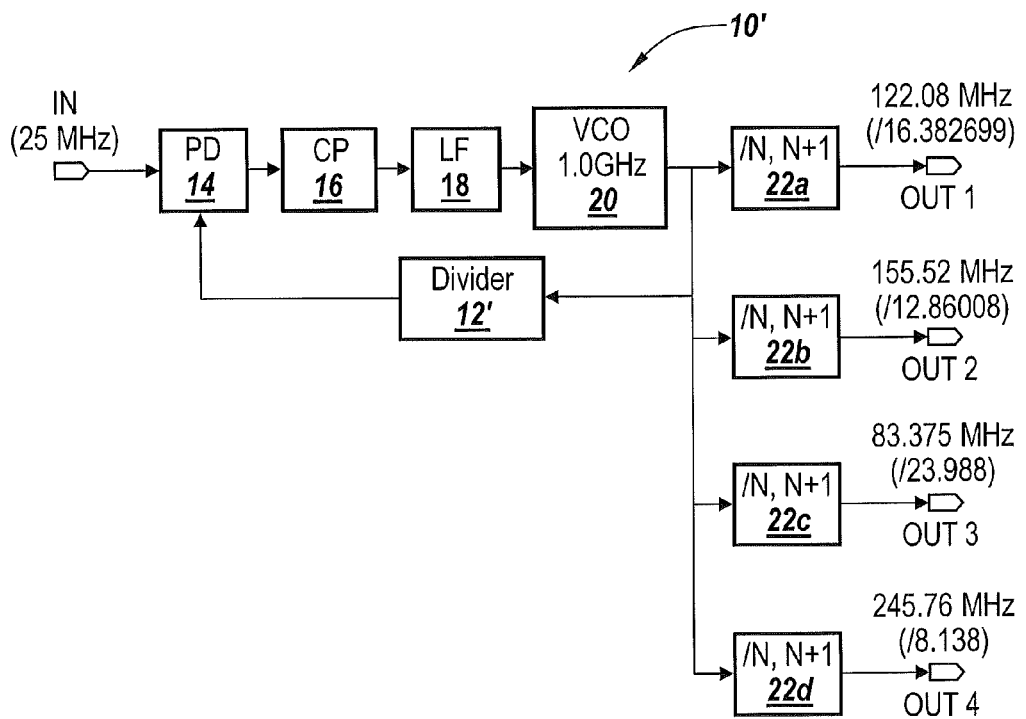
FIG. 1B illustrates a frequency synthesizer that utilizes an integer divider within a feedback path of a phase-locked loop (PLL), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
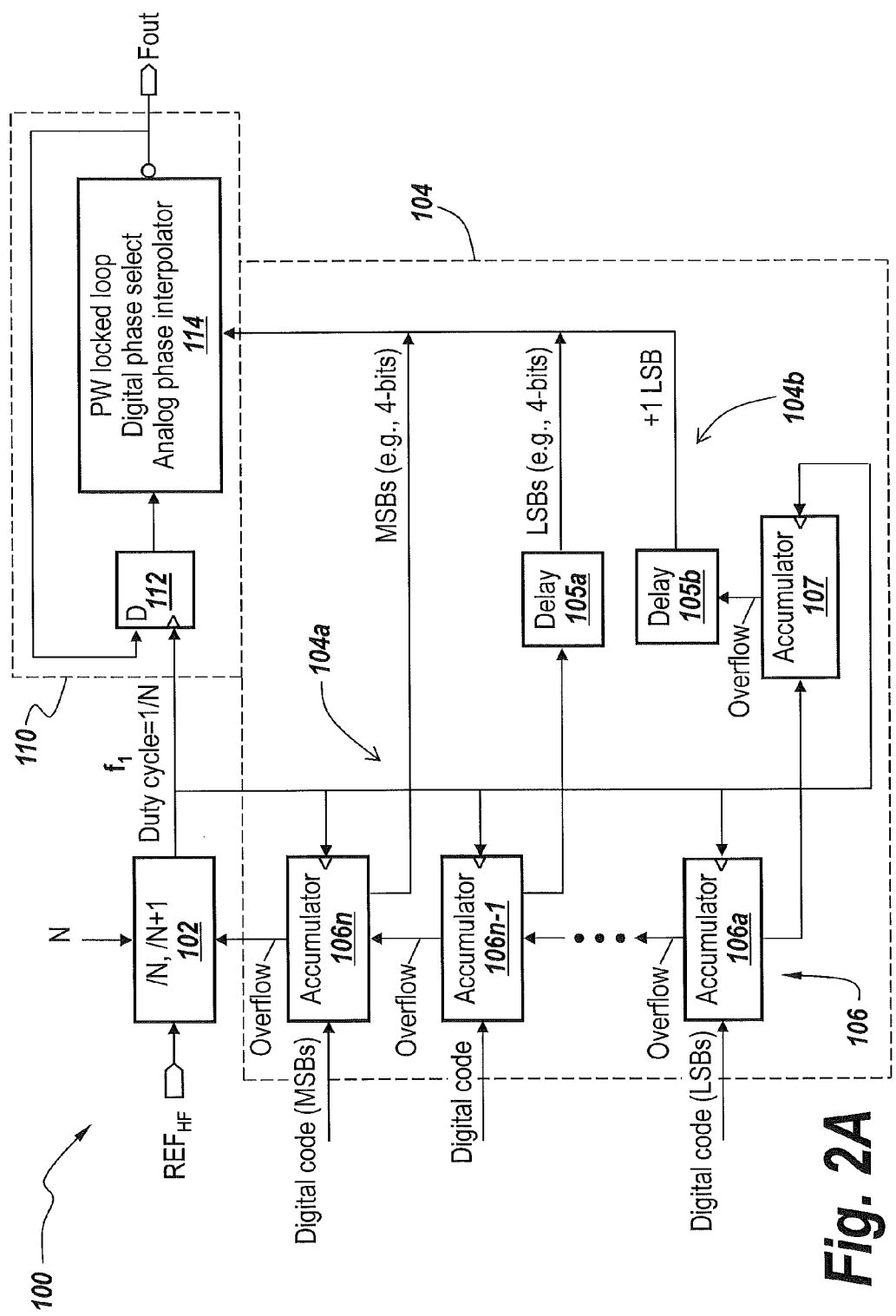
FIG. 2A is a block diagram of a fractional-N divider circuit according to an embodiment of the present invention.
Figure 2B:
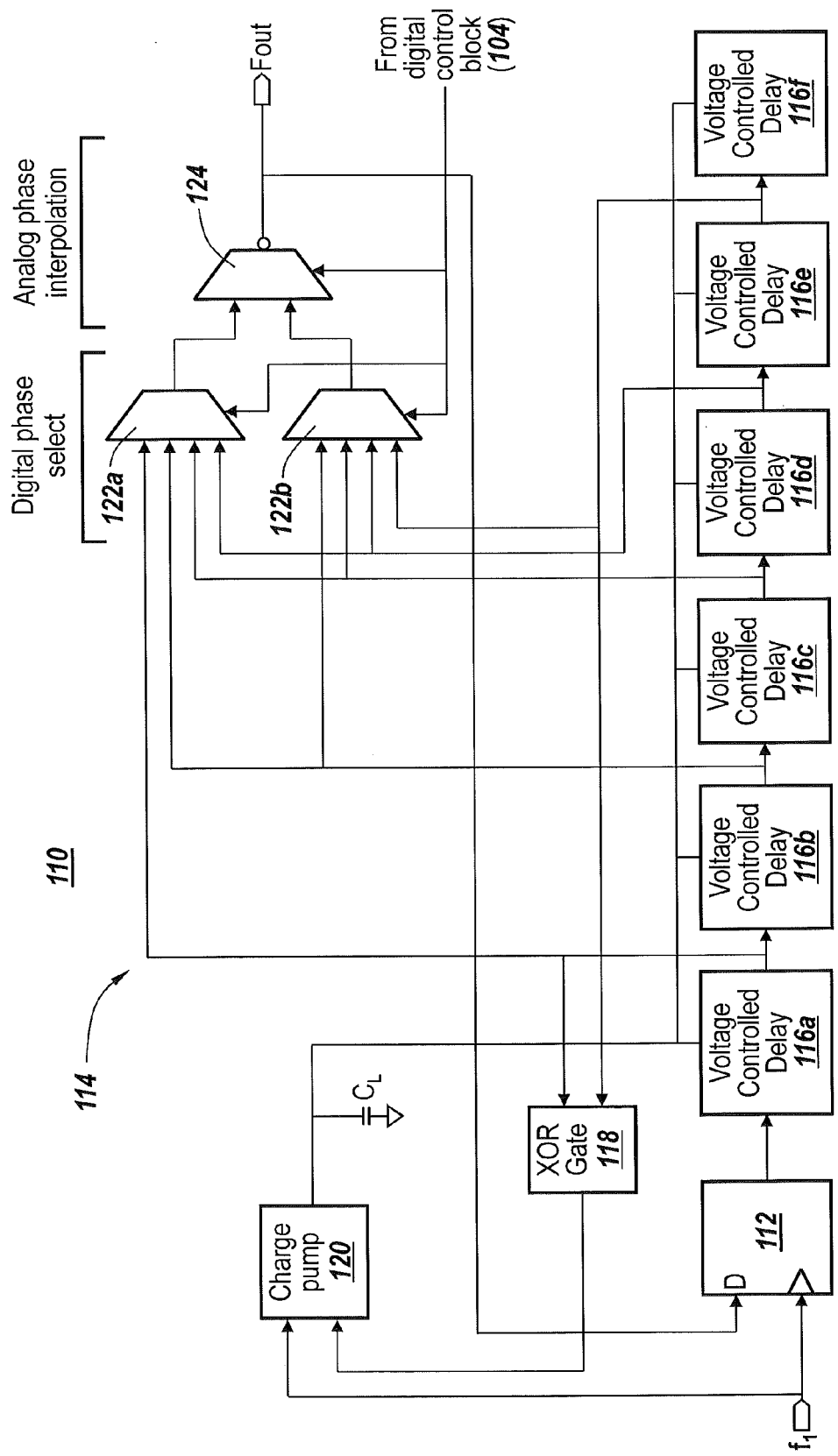
FIG. 2B is a block diagram of an embodiment of the phase correction circuit of FIG. 2A.

Referring now to FIGS. 2A-2B, a fractional-N divider circuit 100 according to some embodiments of the present invention includes a multi-modulus divider 102, which is configured to perform at least /N and /N+1 frequency division of a first reference signal (REF$_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104, which is shown as the divider modulation circuit 104a and the phase error calculator 104b. In particular, the overflow signal is generated in response to a digital code that specifies the sequence of division moduli to be used by the multi-modulus divider 102 when performing the /N and /N+1 frequency division of the first reference signal $REF_{HF}$. The generation of the digital code and the operation of the multi-modulus divider 102 may utilize conventional techniques well known to those skilled in the art.

The divider modulation circuit and phase error calculator 104 of FIG. 2A includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, ..., MSB) of a digital code and corresponding segment overflow signals. The segments 106a-106n may be synchronized with a clock signal, which is shown as a signal ($f_1$) generated by the divider 102. For example, a relatively wide 16-bit segmented accumulator, which is typically needed for high resolution, may be defined by a cascaded arrangement of four 4-bit accumulator segments. Although not wishing to be bound by any theory, the use of a segmented accumulator 106 provides advantages over typical accumulators within conventional delta-sigma modulators because the per cycle delay through the divider modulation circuit 104a is equivalent to the delay through a single segment (106a, ..., 106n) of the accumulator 106, which may need to run at twice a frequency of an output signal (e.g., $F_{OUT}$). In this manner, the segments of the accumulator 106 operate collectively as an adder with at least one cycle (and typically many cycles) of latency. This segmented "adder" does not generate accurate counts with each clock signal, but ultimately yields a correct, albeit delayed, sequence of final overflow signals (from segment 106n) at a potentially much higher frequency rate. As further illustrated by FIG. 2A, the phase error calculator 104b includes a segment (e.g., four-bit) delay block 105a that compensates for the latency between the accumulator segment values associated with segments 106n-1 and 106n. An additional accumulator segment 107 and delay block 105b, which are optional, may be used within the phase error calculator 104b to produce a delta-sigma modulated signal that represents the value in the lower accumulator segments that do not directly feed a phase correction circuit 110.

This phase correction circuit 110 is configured to generate a second reference signal ($F_{OUT}$) in response to the divider output signal ($f_1$) generated by the multi-modulus divider 102. The phase correction circuit 110 is configured so that the second reference signal ($F_{OUT}$) has a substantially jitter-free and uniform duty cycle. In particular, the phase correction circuit 110 is illustrated as including a D-type flip-flop 112, which has a data terminal responsive to the second reference signal $F_{OUT}$ and a synchronization terminal responsive to the divider output signal $f_1$, and a pulse-width locked loop 114. As illustrated and described more fully hereinbelow with respect to FIG. 2B, this pulse-width locked loop 114 may include, among other things, an analog phase interpolator and a digital phase selection circuit.

The phase correction circuit 110 of FIG. 2B includes a pulse-width locked loop 114 that utilizes a delay line containing a plurality of voltage-controlled delay cells 116a-116e to achieve a delay of one VCO period and an additional VCO cell 116f to provide equivalent loading. The pulse-width locked loop 114 further includes an XOR gate 118, which operates as a pulse generator to generate a pulse having a width of four delay blocks from the delay line, a charge pump 120 and capacitive loop filter $C_L$, connected as illustrated. As shown by the four inputs to each of the pair of multiplexers 122a-122b, digital phase selection in fine steps of $T_{VCO}/4$ can be achieved with analog phase interpolation being performed between these finer steps by an output multiplexer 124. This embodiment yields two (2) bits of resolution allocated to the multiplexers and additional bits of resolution in the analog phase interpolator. Although not wishing to be bound by any theory, because the edges of the signals provided to the phase interpolator are closely spaced, they typically do not need to be filtered. The close spacing may also yield greater linearity and preclude any need for trimming.

Figure 3:
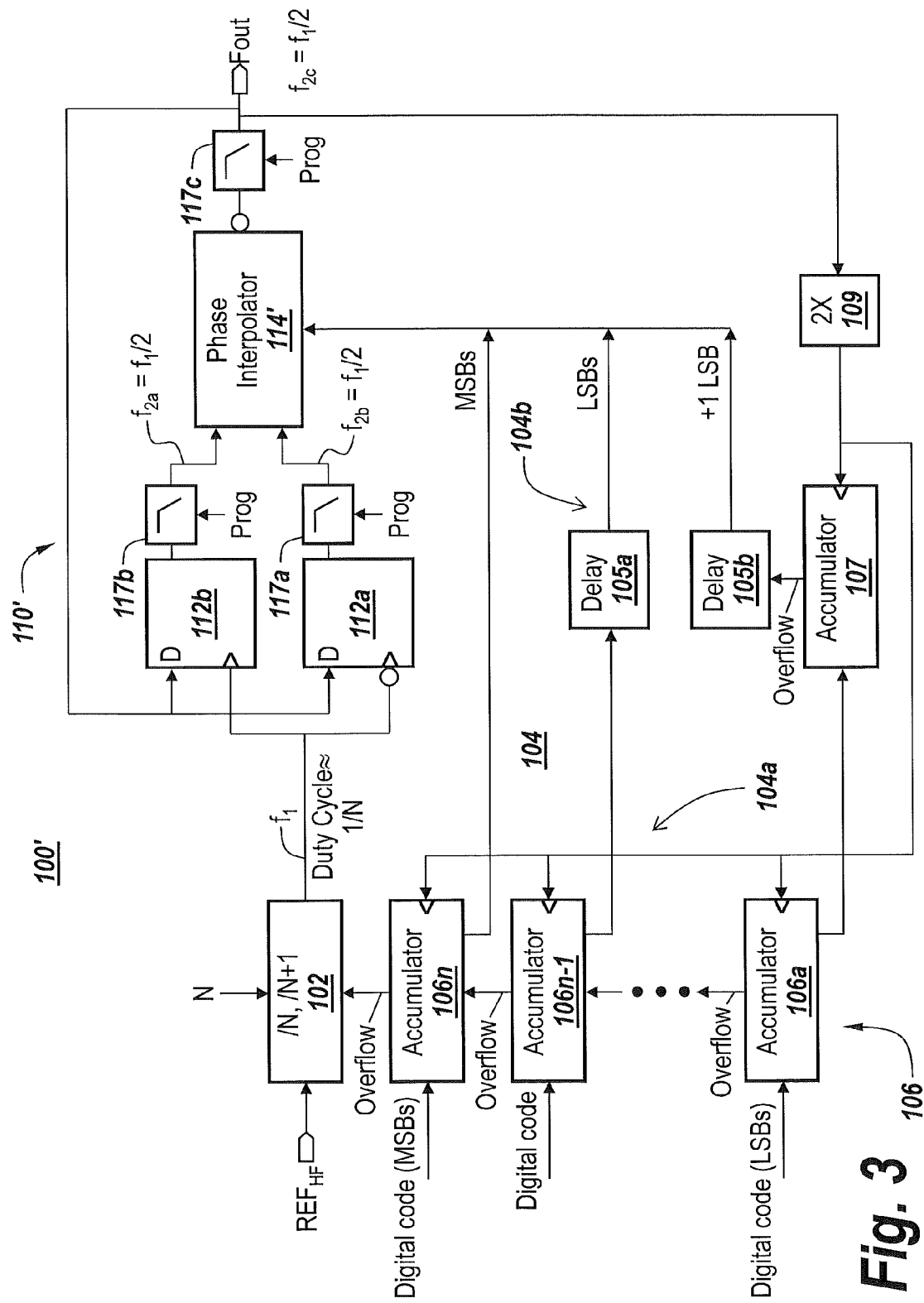
FIG. 3 is a block diagram of a fractional-N divider circuit according to an embodiment of the present invention.

Referring now to FIG. 3, a fractional-N divider circuit 100' according to an additional embodiment of the present invention includes a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit 104a includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, MSB) of a digital code and corresponding segment overflow signals. The phase error calculator 104b includes a plurality of delay elements 105a-150b and an additional accumulator segment 107, which collectively generate multiple bits of a digital phase error that is provided to a phase correction circuit 110'. The accumulator segments 106a-106n and 107 are synchronized with a high frequency clock signal, which may be generated by a frequency multiplier 109.

This phase correction circuit 110' is configured to generate a second reference signal ($F_{OUT}$) in response to a divider output signal ($f_1$) generated by the multi-modulus divider 102. The phase correction circuit 110' is configured so that the second reference signal ($F_{OUT}$) has a substantially jitter-free and uniform duty cycle. The phase correction circuit 110' is illustrated as including a pair of latches (e.g., D-type flip-flops) 112a-112b, which have data terminals responsive to the second reference signal $F_{OUT}$ and synchronization terminals (e.g., clock terminals) responsive to true and complementary versions of the divider output signal $f_1$, which operate as a duty cycle adjustment circuit, and a phase interpolator 114' and which operate as a duty cycle adjustment circuit. This phase interpolator 114' may be configured as an analog multiplexer, which combines two edges of the signals generated by the flip-flops 112a-112b that are separate by one VCO period. Programmable filters 117a-117c are provided for adjusting the edge rates of the input and output signals and, therefore, the linearity of the interpolator 114'.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A fractional-N divider circuit, comprising:
   a multi-modulus divider configured to perform at least /N and /N+1 frequency division of a first reference signal received at a first input thereof in response to an overflow signal received at a second input thereof, where N is an integer greater than one;

a phase correction circuit configured to generate a second reference signal in response to a divider output signal generated by said multi-modulus divider, said second reference signal having a duty cycle that is more nearly uniform relative to the divider output signal;

a divider modulation circuit configured to generate the overflow signal in response to a code that specifies a plurality of division moduli to be used by said multi-modulus divider during the at least /N and /N+1 frequency division of the first reference signal, said divider modulation circuit comprising a segmented accumulator configured to generate a plurality of segments of a count value having at least one period of latency therebetween; and a phase error calculator configured to provide at least one segment of the count value to said phase correction circuit.

2. The divider circuit of claim 1, wherein the code is a digital code that specifies a repeating sequence of division moduli to be used by said multi-modulus divider during the at least /N and /N+1 frequency division of the first reference signal.

3. The divider circuit of claim 1, wherein said phase correction circuit comprises a pulse-width locked loop.

4. The divider circuit of claim 3, wherein said pulse-width locked loop comprises a delay line having a plurality of voltage-controlled delay cells therein.

5. The divider circuit of claim 3, wherein said phase correction circuit comprises a latch having a synchronization terminal responsive to the divider output signal; and wherein the second reference signal is fed back to a data input terminal of the latch.

6. The divider circuit of claim 1, wherein said phase correction circuit is responsive to a digital quantization error generated by said divider modulation circuit and said phase error calculator.

7. A fractional-N divider circuit, comprising:
a multi-modulus divider configured to perform at least /N and /N+1 frequency division of a first reference signal received at a first input thereof in response to an overflow signal received at a second input thereof, where N is an integer greater than one;

a phase correction circuit configured to generate a second reference signal in response to a divider output signal generated by said multi-modulus divider, said second reference signal having a duty cycle that is more nearly uniform relative to the divider output signal; and a divider modulation circuit configured to generate the overflow signal in response to a digital code that specifies a plurality of division moduli to be used by said multi-modulus divider during the at least /N and /N+1 frequency division of the first reference signal, said divider modulation circuit comprising a segmented accumulator configured to generate a plurality of segments of a count value having at least one period of latency therebetween, said segmented accumulator comprising a first accumulator segment responsive to a plurality of least significant bits of the digital code and last accumulator segment responsive to a plurality of most significant bits of the digital code.

8. The divider circuit of claim 7, wherein each of the first and last accumulator segments is synchronized to an accumulator clock signal and generates a respective segment overflow signal.

9. The divider circuit of claim 7, wherein each of the first and last accumulator segments is synchronized to the divider output signal.

10. The divider circuit of claim 9, wherein said phase correction circuit comprises a pulse-width locked loop.

11. The divider circuit of claim 7, further comprising a phase error calculator configured to provide at least one segment of the count value to said phase correction circuit.

12. A fractional-N divider circuit, comprising:
a multi-modulus divider configured to perform at least /N and /N+1 frequency division of a first reference signal received at a first input thereof in response to an overflow signal received at a second input thereof, where N is an integer greater than one;

a phase correction circuit configured to generate a second reference signal in response to a divider output signal generated by said multi-modulus divider, said phase correction circuit comprising:
a duty cycle adjustment circuit responsive to the divider output signal and a feedback signal derived from the second reference signal; and
a phase interpolator responsive to at least one signal generated by said duty cycle adjustment circuit;

a divider modulation circuit configured to generate the overflow signal in response to a code that specifies a plurality of division moduli to be used by said multi-modulus divider during the at least /N and /N+1 frequency division of the first reference signal; and a phase error calculator configured to provide at least one segment of a count value generated by said divider modulation circuit to said phase correction circuit.

13. The divider circuit of claim 12, wherein the at least one signal has an approximately uniform duty cycle.

14. The divider circuit of claim 12, wherein the second reference signal has a duty cycle that is more nearly uniform relative to the divider output signal.

15. The divider circuit of claim 12, wherein said divider modulation circuit comprises a segmented accumulator configured to generate a plurality of segments of the count value having at least one period of latency therebetween.

16. A fractional-N divider circuit, comprising:
a multi-modulus divider configured to perform at least /N and /N+1 frequency division of a first reference signal received at a first input thereof in response to an overflow signal received at a second input thereof, where N is an integer greater than one;

a phase correction circuit configured to generate a second reference signal in response to a divider output signal generated by said multi-modulus divider, said phase correction circuit comprising:
a duty cycle adjustment circuit responsive to the divider output signal and a feedback signal derived from the second reference signal, said duty cycle adjustment circuit comprising a pair of latches having data terminals responsive to the feedback signal and clock terminals responsive to true and complementary versions of the divider output signal; and
a phase interpolator responsive to at least one signal generated by said duty cycle adjustment circuit; and a divider modulation circuit configured to generate the overflow signal in response to a code that specifies a plurality of division moduli to be used by said multi-modulus divider during the at least /N and /N+1 frequency division of the first reference signal.

17. The divider circuit of claim 16, wherein the phase interpolator is responsive to a pair of signals derived from outputs of the pair of latches.

18. A fractional-N divider circuit, comprising:
a multi-modulus divider configured to perform at least /N and /N+1 frequency division of a first reference signal received at a first input thereof in response to an overflow signal received at a second input thereof, where N is an integer greater than one;

a phase correction circuit configured to generate a second reference signal in response to a divider output signal generated by said multi-modulus divider, said phase correction circuit comprising:

a duty cycle adjustment circuit responsive to the divider output signal and a feedback signal derived from the second reference signal; and a phase interpolator responsive to at least one signal generated by said duty cycle adjustment circuit; and a divider modulation circuit configured to generate the overflow signal in response to a digital code that specifies a repeating sequence of division moduli to be used by said multi-modulus divider during the at least /N and /N+1 frequency division of the first reference signal, said divider modulation circuit comprising a segmented accumulator configured to generate a plurality of segments of a count value having at least one period of latency therebetween, said segmented accumulator comprising a first accumulator segment responsive to a plurality of least significant bits of the digital code and last accumulator segment responsive to a plurality of most significant bits of the digital code.

19. The divider circuit of claim 18, wherein each of the first and last accumulator segments is synchronized to an accumulator clock signal and generates a respective segment overflow signal.

20. The divider circuit of claim 18, wherein each of the first and last accumulator segments is synchronized to a synchronizing signal derived from the second reference signal.

21. The divider circuit of claim 20, wherein the synchronizing signal has a frequency greater than a frequency of the second reference signal.

\* \* \* \* \*